United States Patent [19]

Atallah et al.

[11] Patent Number: 5,453,705
[45] Date of Patent: Sep. 26, 1995

[54] REDUCED POWER VLSI CHIP AND DRIVER CIRCUIT

[75] Inventors: Francois I. Atallah; Anthony Correale, Jr., both of Raleigh; Charles K. Robinson, Apex; Geoffrey B. Stephens, Cary, all of N.C.

[73] Assignee: International Business Machines Corporation, Armonk, N.Y.

[21] Appl. No.: 171,482

[22] Filed: Dec. 21, 1993

[51] Int. Cl.$^6$ .................................. H03K 19/003
[52] U.S. Cl. .................. 326/86; 326/17; 326/27; 326/81; 395/800
[58] Field of Search ............. 395/800; 307/443, 307/451, 542, 575, 576, 585, 270, 290; 326/17, 27, 81, 86

[56] References Cited

U.S. PATENT DOCUMENTS

| | | | |
|---|---|---|---|
| 4,168,796 | 9/1979 | Fulks et al. | 371/22.6 |
| 4,488,066 | 12/1984 | Shoji | 326/86 |
| 4,626,711 | 12/1986 | Li | 307/471 |
| 4,638,187 | 1/1987 | Boler et al. | 307/451 |
| 4,709,162 | 11/1987 | Braceras et al. | 326/81 |
| 4,782,250 | 11/1988 | Adams et al. | 327/108 |
| 4,831,558 | 5/1989 | Shoup et al. | 364/550 |
| 4,877,980 | 10/1989 | Kubinec | 327/110 |
| 4,928,023 | 5/1990 | Marshall | 326/27 |
| 4,952,818 | 8/1990 | Erdelyi et al. | 327/108 |
| 4,959,561 | 9/1990 | McDermott et al. | 326/27 |
| 4,965,464 | 10/1990 | Von Basse et al. | 327/111 |
| 4,983,860 | 1/1991 | Yim et al. | 326/17 |
| 4,988,888 | 1/1991 | Hirose et al. | 326/27 |
| 5,151,619 | 9/1992 | Austin et al. | 326/86 |
| 5,255,222 | 10/1993 | Eaton, Jr. | 365/189.09 |
| 5,281,862 | 1/1994 | Ma | 327/108 |

*Primary Examiner*—Alyssa H. Bowler
*Assistant Examiner*—John Follansbee
*Attorney, Agent, or Firm*—George E. Clark; Steven B. Phillips; Kelly K. Kordzik

[57] ABSTRACT

A VLSI chip is disclosed having reduced power dissipation. This is accomplished by limiting the output voltage swing at the output of off chip driver circuits by utilization of a control circuit to regulate the gate bias voltage of an NFET pull-up transistor coupled to the output of the driver circuit and by feeding back the output of the driver circuit to the control circuit.

2 Claims, 4 Drawing Sheets

REDUCED POWER VLSI CHIP AND DRIVER CIRCUIT

TECHNICAL FIELD OF THE INVENTION

The present invention relates to CMOS VLSI chip design, and more particularly, to a VLSI chip and card with reduced power dissipation.

BACKGROUND OF THE INVENTION

When designing very large scale integration ("VLSI") microchips, it is important that the power dissipation of each component be measured and accounted for so that the components are not required to operate outside of the temperature range designed for the components and the packaging utilized to encase the components. Nevertheless, many of today's VLSI chip designs, especially those implemented with CMOS FETs (complementary metal-oxide semiconductor field-effect transistors), exceed the maximum power dissipation limits allowed for many low-cost plastic packages utilized to encase the chips. The result is a resortment to higher cost packaging solutions, which of course results in higher costs passed to the end user.

Off-chip driver circuits ("OCDs") are often utilized as buffers for the input and output of signals to and from VLSI microchip logic. A large percentage of the total chip power is contributed by the OCDs. FIG. 4 illustrates conventional CMOS OCD 40 with pull-up transistor Q1 and pull-down transistor Q2 in an inverter arrangement typical of OCDs. Most of the power dissipated by an OCD is AC power, which has two primary sources. First, there is the power associated with charging and discharging the large output load capacitance $C_L$ typically coupled to the OCD. Second, if pull-up and pull-down transistors Q1 and Q2 are on simultaneously during an output transition (i.e., from high to low or from low to high), considerable power may be dissipated due to the short-circuit current from voltage source $V_{DD}$ to source $V_{SS}$. Assuming that the short-circuit power is minimized, the majority of the AC power dissipated by OCD 40 is in charging and discharging the load capacitance $C_L$. This power is represented by the following equation:

$$P_{AC} = 0.5 f C_L \left[ \frac{V_{OH}^2 + (V_{DD} - (V_{DD} - V_{OH}))^2}{2} \right] = 0.5 f C_L V_{DD} V_{OH}$$

where, $P_{AC}$ is the AC power in milliwatts, 0.5 is the multiplier to account for a single switch in the output per clock period, f is the switching frequency in gigahertz, $C_L$ is the load capacitance in picofarads, $V_{DD}$ is the power supply voltage, and $V_{OH}$ is the maximum output high voltage the driver can obtain.

As shown in the typical waveforms in FIG. 5, OCD 40 has a full output voltage swing. Therefore, the maximum output high voltage, $V_{OH}$, is equal to $V_{DD}$, and the above equation reduces to:

$$P_{AC} = 0.5 f C_L V_{DD}^2$$

Therefore, one solution for dissipating less power in a CMOS OCD is to reduce the output voltage swing. However, the only way to reduce the output voltage swing in conventional OCD 40 is to reduce the voltage at power supply $V_{DD}$. To accomplish this feat, an additional power supply would have to be provided within the VLSI circuitry. This is not economical to do so, since CMOS circuitry typically requires a 5 volt power supply (i.e., the original voltage $V_{DD}$) to operate effectively. To add a separate lower voltage power supply would increase the circuitry within the VLSI chip, and add to its corresponding cost.

The following example illustrates the reduction in AC power that may be achieved by a reduced voltage OCD which limits the output voltage swing (i.e., $V_{OH}$) without requiring a separate power supply. For the purposes of this illustration, an output up-level voltage of 3.0 volts was selected as the design point for this reduced voltage OCD.

Let f=20 MHz (0.02 GHz), $C_L$=75 pF, and $V_{DD}$=5.0 volts.

For a conventional, full output swing OCD: $P_{AC}$= 0.5(.02)(75)(5)$^2$=18.75 mW.

For a reduced voltage OCD with $V_{OH}$=3 volts:

$P_{AC}$=05(.02)(75)(5)(3)=11.25mW.

As shown in this example, the reduced voltage OCD dissipates 40 percent less AC power in charging and discharging the load capacitance than the conventional OCD.

Referring next to FIG. 6, there is illustrated a prior art solution for achieving a reduced voltage OCD using an n-channel field-effect transistor ("NFET") pull-up transistor (Q1). NFET pull-ups are traditionally used in such circuits for optimizing output rising transition speed. Since the threshold voltage $V_{THN}$ of NFET Q1 is positive, the driven output voltage of OCD 60 is reduced to one threshold voltage drop below the gate potential. Though this characteristic is undesirable for full output swing driver circuits because the up-level is diminished, it is typically exploited in reduced voltage OCDs.

Nevertheless, OCD 60, which applies a full up-level ($V_{DD}$) to the output NFET gate, does not result in optimized power reduction. The output up-level voltage of OCD 60 as compared to the full voltage swing OCD 10 of FIG. 1 is one $V_{THN}$ below the power supply (i.e., $V_{OH} = V_{DD} - V_{THN}$). The effective power reduction in this instance is limited to:

$$1 - \left[ \frac{V_{DD}(V_{DD} - V_{THN})}{V_{DD}^2} \right] = 1 - \left[ \frac{V_{DD} - V_{THN}}{V_{DD}} \right] = \frac{V_{THN}}{V_{DD}}$$

This is typically in the range of 10 percent, which is not near the 40 percent achieved by limiting the output voltage swing as shown above.

Therefore, what is needed is a CMOS OCD that reduces output voltage swing in order to optimize power reduction, yet provides performance characteristics comparable to full voltage swing OCD designs.

SUMMARY OF THE INVENTION

Thus, it is a primary object of the present invention to reduce power dissipation by a VLSI chip having a number of OCDs, thus eliminating a requirement for a higher cost packaging solution.

In the attainment of the above primary object, the present invention discloses a VLSI chip having one or more OCDs, which use a special circuit, including output feedback, to control the gate bias of an NFET pull-up transistor used within an inverter circuit arrangement commonly utilized within OCD. The control circuit limits the swing of the output voltage thus reducing the AC power dissipation associated with charging and discharging the large output load capacitance coupled to the OCD.

A preferred embodiment of the present invention is intended for use in off-chip applications where very high capacitive loads (100 pf) are typical and transistor-transistor logic ("TTL") voltage levels are the standard. TTL permits uplevel voltages of 2.2 volts to 5.5 volts. The higher uplevel is limited by the resident power supply. In an effort to reduce the output transient power and hence noise, a reduced output voltage approach is employed. The output stage of the OCD is comprised of enhancement NFETs for the pull-up and pull-down devices. The output voltage is not limited to a fixed limit equal to the threshold voltage of the pull-up device, as is the case in prior art circuits as discussed previously, but to a voltage in the range of 3 volts. This limit can vary to a low of 2.4 volts if any uplevel current demand is required.

The output voltage is controlled by a pull-up gate bias network comprised of a switched p-channel FET ("PFET") current source, a diffusion resistance and an NFET pull-down device in a feedback arrangement, whose conductivity is controlled directly by the output. Since the output on a rising transition is initially low, the feedback device is cut off allowing the gate of the pull-up output device to rise quickly to the power supply potential. Since the output is essentially a source follower, the output begins to rise following the input. Then as the output rises beyond the threshold voltage of the NFET feedback device, this device begins to conduct thereby altering the power supply bias that is currently on the gate of the pull-up output device. This feedback device continues to conduct with enhanced capability as the output potential rises.

The ratio of the switched NFET feedback device, the switched PFET current source device, and the resistors defines the bias point. The feedback device is directly employed in establishing the bias point through the use of the bias (voltage divider) resistors which allow setting the bias point to any voltage.

The output voltage is not limited to the bias controlled limits in external dotted applications. That is, external dotted drivers (drivers whose outputs are tied together) of full potential can pull the output up to the power supply rail without adverse power dissipation.

Furthermore, the present invention may be embodied in a VLSI chip having a number of tri-statable OCDs which can place the output in a high impedance non-controlling state with no DC power dissipation.

A technical advantage of the present invention is that it provides for a reduced voltage OCD whose lower power dissipation allows for the implementation of low-cost plastic VLSI chip packaging.

And, another technical advantage of the present invention is that it provides for a reduced voltage CMOS OCD with reduced power dissipation, while providing performance characteristics comparable to full voltage swing OCD designs.

Another technical advantage of the present invention is that it employs a tri-statable OCD which can place the output of the driver in a non-controlling state with no DC power dissipation.

Yet another technical advantage of the present invention is that it provides voltage divider resistors within the controlled circuitry permitting the setting of the bias point of the pull-up device to any voltage within predetermined limits.

Yet still another technical advantage of the present invention is that it provides for a reduced voltage OCD without requiring a separate power supply.

An additional technical advantage of the present invention is that it provides for a reduced voltage OCD having reduced sensitivity to process and power supply variations.

Another technical advantage of the present invention is that it provides for a reduced voltage OCD having a reduction in short circuit current in the output stage of the circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
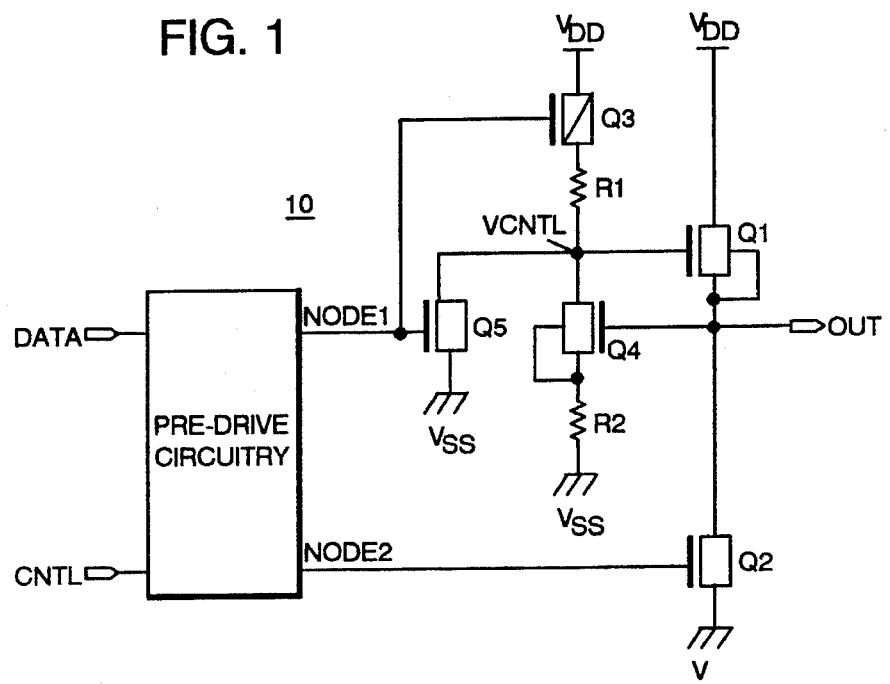
FIG. 1 illustrates an OCD according to the present invention.

Referring to FIG. 1, there is illustrated a circuit diagram of a preferred embodiment of CMOS OCD 10 of the present invention. The circuit, being made in the CMOS technology, has its p-channel field effect transistors indicated by a rectangle with a diagonal line formed therein and a gate electrode arranged adjacent thereto and its n-channel field effect transistors indicated by a rectangle without a diagonal line and a gate electrode arranged adjacent thereto.

CMOS OCD 10 includes a DATA terminal and a control (CNTL) terminal for input into OCD 10, and an output terminal, labelled OUT, which may be coupled to VLSI circuitry in a desired manner as discussed below.

Since the device channel widths of the output devices in circuit 10 (Q1–Q5) are large to quickly charge or discharge the output load capacitance, which is coupled to OUT, they represent large capacitive loads to the circuitry driving them.

Figure 4:
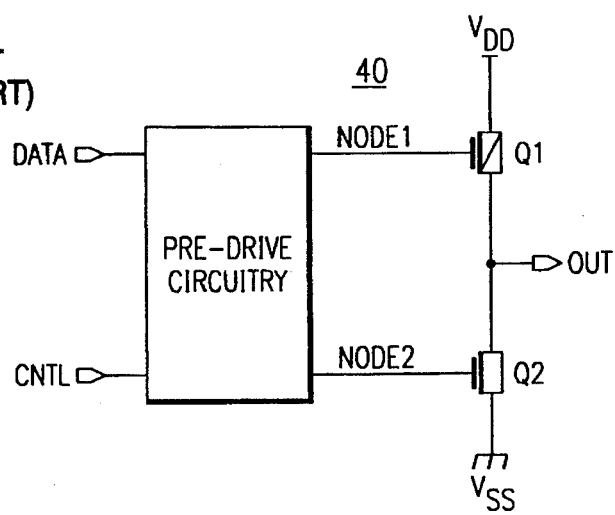
FIG. 4 illustrates a prior art conventional CMOS OCD.
Figure 5:
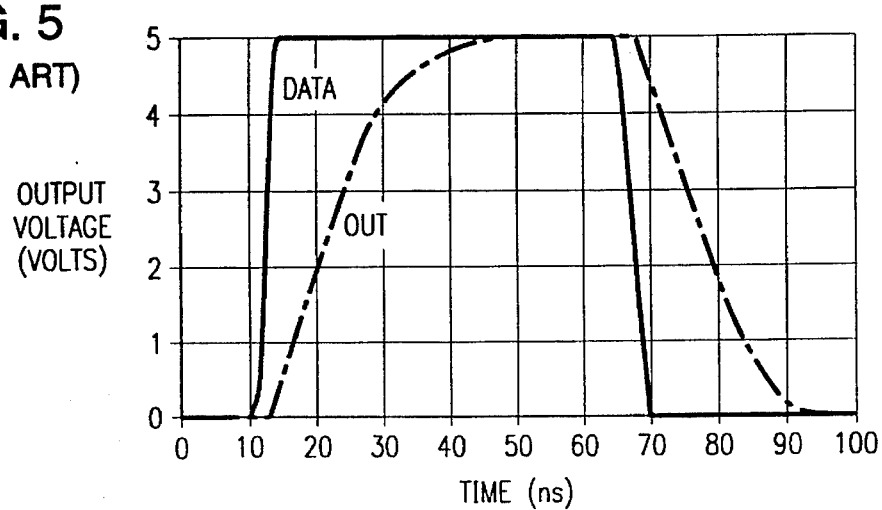
FIG. 5 illustrates simulated input and output waveforms for the prior art conventional CMOS OCD of FIG. 4.
Figure 6:
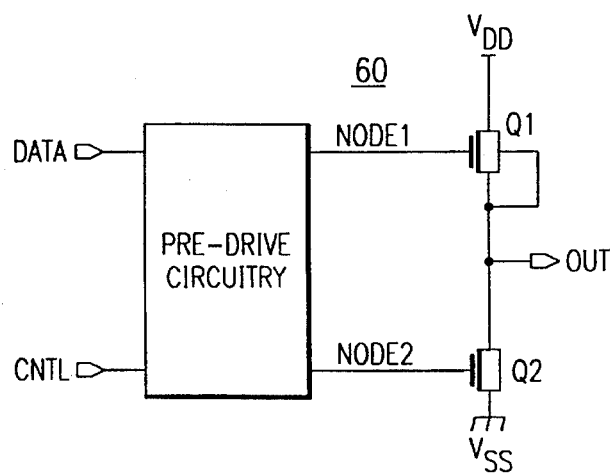
FIG. 6 illustrates a prior art conventional reduced voltage OCD utilizing an NFET pull-up.

An intermediate, or pre-drive stage is required to buffer the gate of the output devices from the logic circuits, which are coupled to terminals DATA and CNTL. The pre-drive circuitry consists of NFETs and PFETs whose device widths are larger than those of typical logic gates, but smaller than those of transistor Q2, or devices Q1 and Q2 illustrated in FIGS. 4 and 6.

The node labelled NODE1, which is outputted from the pre-drive circuitry, is coupled to the gate electrode of n-channel FET Q5, and to the gate electrode of p-channel FET Q3. N-channel FET Q5 has its source electrode coupled to power supply $V_{SS}$. The drain electrode of device Q5 is coupled to node VCNTL.

P-channel FET Q3 has its drain electrode coupled to power supply $V_{DD}$ and its source electrode coupled to resistance R1. Resistance R1 is also coupled to node VCNTL. Additionally, node VCNTL is also coupled to the drain electrode of n-channel FET Q4 and the gate electrode of n-channel FET Q1. The source electrode of device Q4 is coupled to power supply $V_{SS}$ through resistance R2. The gate electrode of device Q4 is coupled to output terminal OUT of OCD 10.

The drain electrode of n-channel FET Q1 is coupled to power supply $V_{DD}$. Device Q1 has its source electrode coupled to output terminal OUT of OCD 10.

NODE2 emanating from the pre-drive circuitry is coupled to the gate electrode of n-channel FET Q2, which has its source electrode coupled to power supply $V_{SS}$ and its drain electrode coupled to output terminal OUT of OCD 10.

The bulk (p-well) nodes of devices Q1 and Q4 are coupled to their respective sources to eliminate any body effects. A discussion of body effects may be found on pages 38–39 of *Principles of CMOS VLSI Design, A Systems Perspective,* Neal Weste and Camran Eshraghian, copyright 1985, Addison Wesley, which is herein incorporated by reference. For an n-well process the same circuit configuration can be utilized by grounding the bulk nodes of devices Q1 and Q4.

To maximize the effectiveness of OCD 10, the gate voltage of NFET pull-up Q1 must be controlled. Since the output "follows" the gate of NFET pull-up Q1, it is desirable to regulate the gate bias such that the output at terminal OUT is limited to a $V_{OH}$ less than $V_{THN}$ below $V_{DD}$, while providing a transient response comparable to full voltage swing OCDs. These objectives have traditionally been mutually exclusive in OCD design. A circuit which clamps the gate of the NFET pull-up to $V_{OH}+V_{THN}$ results in optimal AC power reduction at the expense of AC performance. Alternatively, a circuit which applies a full $V_{DD}$ gate bias on NFET pull-up Q1 provides the best performance, but without significant power reduction.

As previously discussed, a primary object of the present invention is to reduce the output voltage swing in order to reduce the power dissipation within OCD 10, as illustrated by the previously described equations.

In a manner to be described below, OCD 10 uses a special circuit to control the gate bias of NFET pull-up transistor Q1. OCD 10 was designed in a commercially available p-well process, which uses a 5-volt power supply $V_{DD}$.

The steady-state voltage achieved in OCD 10 when the output at terminal OUT is "high" is an n-channel threshold voltage ($V_{THN}$) below the voltage at node VCNTL (i.e., $V_{OUT}=V_{CTNL}-V_{THN}$). The voltage at node VCNTL is set by the transistor-resistor stack consisting of transistors Q3 and Q4 and resistors R1 and R2.

Note that when the output at terminal OUT is high, DC current $I_{CNTL}$ flows through devices Q3, R1, Q4 and R2. If transistor Q3 is sized so that its "on" resistance is negligible when compared to the resistance of device R1, the voltage at node VCNTL can be approximated by the following equation:

$$V_{CNTL} \approx V_{DD}-I_{CNTL} \times R1$$

For the desired steady-state voltages at node VCNTL and output terminal OUT, transistor Q4 and resistor R2 are sized to obtain DC current $I_{CNTL}$. One skilled in the art can size device Q4 and resistor R2 to cause $I_{CNTL}$ to be small to minimize the DC power contribution, thus allowing optimal overall power reduction.

Referring again to FIG. 1, the overall non-tristate operation of OCD 10 is described below. The CNTL signal into the pre-drive section is set to enable OCD 10.

For a low-high output transition at terminal OUT, both NODE1 and NODE2 switch from high to low turning device Q2 off, device Q3 on, and device Q5 off. Transistor Q4 is initially off. When device Q3 turns on, node VCNTL switches to voltage $V_{DD}$. As a result, transistor Q1 turns on, and the output at terminal OUT "follows" the voltage at node VCNTL. Since node VCNTL is biased at voltage $V_{DD}$, NFET Q1 has a full voltage $V_{DD}$ gate drive. This allows output terminal OUT to respond very quickly. As output terminal OUT switches from low to high, transistor Q4 turns on to pull node VCNTL back to near its designed value. However, since output terminal OUT switches faster than this occurs, it reaches a voltage greater than the steady-state value of $V_{CNTL}-V_{THN}$. The difference between the actual output high voltage and the designed value depends on the process (fast, slow, etc.), temperature, and load capacitance. Under the conditions of most concern for power (i.e, fast process and high temperature), the output voltage $V_{OH}$ is typically less than 20 percent greater than the design point. This is significantly lower than the $V_{OH}$ of the previously discussed conventional reduced voltage OCD 60 for the same process and temperature conditions.

For a high-low output transition at terminal OUT, both NODE1 and NODE2 switch from low to high turning transistor Q2 on, transistor Q3 off, and transistor Q5 on. When transistor Q5 turns on, node VCNTL is pulled low turning transistor Q1 off. Transistor Q2 turning on pulls terminal OUT low.

Figure 2:
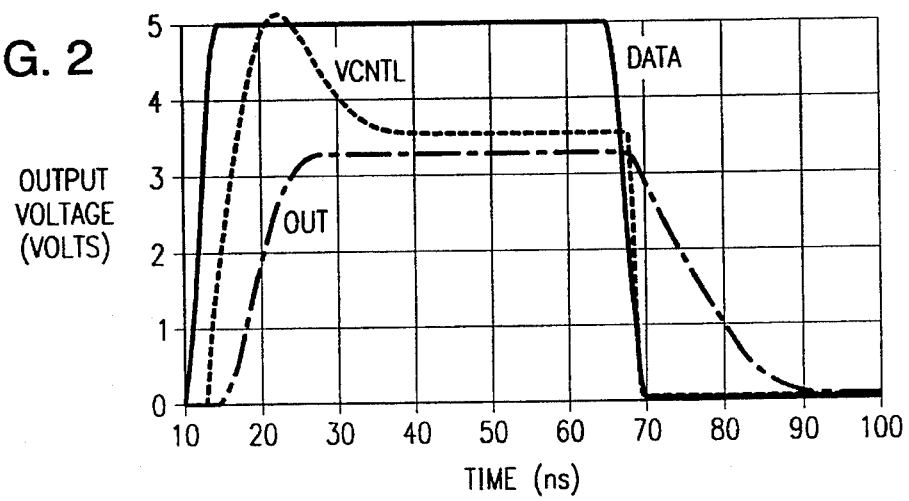
FIG. 2 illustrates simulated input and output waveforms for the OCD of FIG. 1.

The voltage waveforms for OCD 10 are shown in FIG. 2. Both rising and falling transitions for node VCNTL and terminal OUT are illustrated. Note that terminal OUT has only a capacitive load $C_L$ without any DC current demand. As illustrated in FIG. 1, the control circuit enhances the gate overdrive of device Q1 produced at node VCNTL during the output rising transition and reduces this overdrive to maintain the desired output up-level at terminal OUT when the transition is complete.

Referring once again to the low to high output transition, the output $V_{OH}$ is greater than the design point (3 volts in this example). As a result, transistor Q1 is off, and transistor Q4 is driven harder which results in a lower potential on node VCNTL. Since transistor Q1 is off, any current demanded by the load causes a reduction in the output up-level voltage. This reduction decreases the gate drive on transistor Q4, which in turn increases the bias on node VCNTL. The combination of decreased voltage $V_{OH}$ and increased voltage at VCNTL allows transistor Q1, when turned on, to attempt to maintain the desired current without further decrease in $V_{OH}$. This highly desirable compensation feature is not unlimited. The device sizes and design points selected will dictate the effectiveness of this feature.

Figure 3:
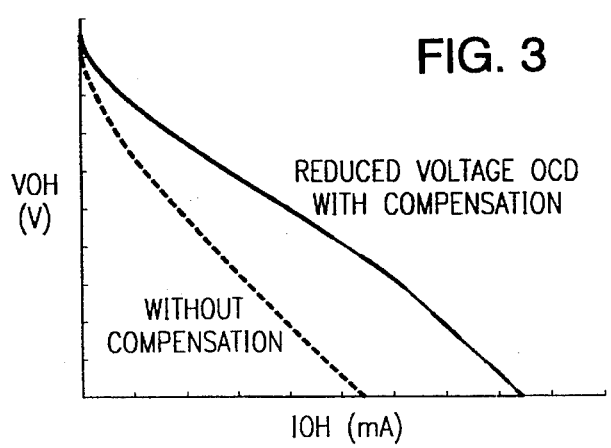
FIG. 3 illustrates a VOH versus IOH curve for the OCD of FIG. 1.

Referring next to FIG. 3, there is illustrated sample $V_{OH}$ versus $I_{OH}$ curves for OCD 10 with the aforementioned compensation feature and a prior art reduced voltage OCD without compensation which clamps the gate voltage of an NFET pull-up, but does not compensate for decreases in $V_{OH}$ due to DC load current. From the curves, one can see that OCD 10, as implemented by this disclosure, has a significantly higher current sourcing capability than a conventional reduced voltage OCD using the same size NFET pull-up transistor.

Power dissipation of any OCD must account for any short-circuit current associated with the switching of the output stage. An additional benefit of this invention is that the short-circuit power, resulting from devices Q1 and Q2 being "on" simultaneously during an output transition at terminal OUT, is minimized. On a low-high output transition, NODE2 switches low, turning device Q2 off before node VCNTL switches high to turn on device Q1. On a high-low output transition node VCNTL switches low much faster than the output at terminal OUT. Consequently, transistor Q1 does not turn on. Additionally, note that the size of transistor Q5 can be varied to compensate for skews between the NODE1 and NODE2 delays from the pre-drive circuitry.

Any OCD must be capable of operating effectively regardless of variation in process, temperature, or power supply. The control circuit for OCD 10 minimizes the adverse effects of process and power supply variation. Due to the tracking between devices Q1 and Q4, the sensitivity of the output up-level at terminal OUT to any NFET process variation is significantly reduced. Furthermore, since the control circuit and output stage are "free" of any PFET devices which affect the output performance and up-level (PFET Q3 is sized so that it is basically a switch), the effects of variation in the PFET process are minimized. Furthermore, the sensitivity to power supply $V_{DD}$ tolerances is reduced by approximately the ratio of $V_{CNTL}/V_{DD}$ due to the voltage division provided by resistors R1 and R2.

Figure 7:
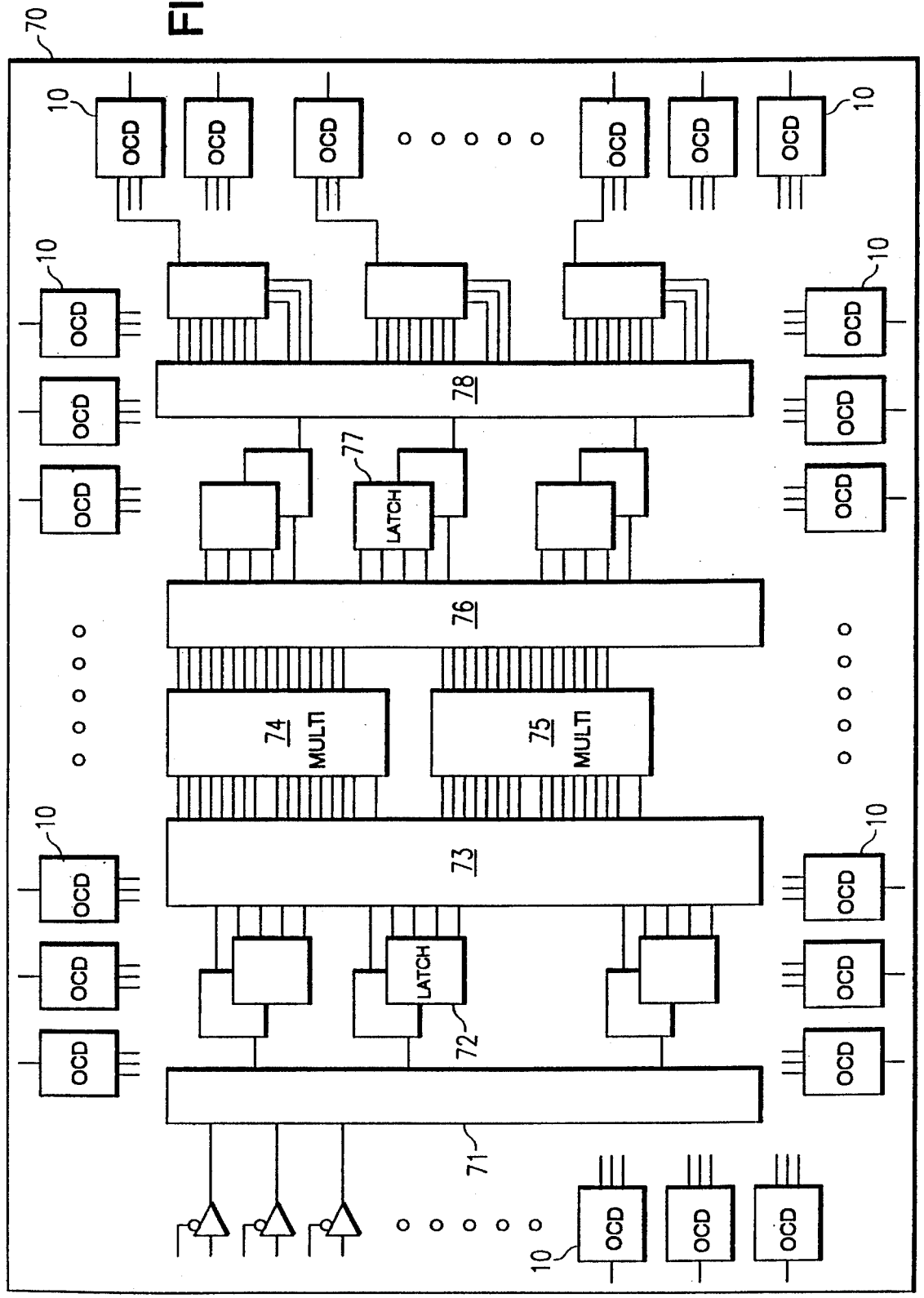
FIG. 7 illustrates a VLSI microchip design embodying the present invention.

Referring next to FIG. 7, there is shown an exemplary embodiment of the present invention. CMOS VLSI circuit 70 includes combinatorial logic circuits 71, 73, 76 and 78, a plurality of latches 72 and 77, multipliers 74 and 75 and a plurality of OCDs 10. Of course, any integrated circuit utilizing OCDs could be substituted for circuit 70.

Figure 8:
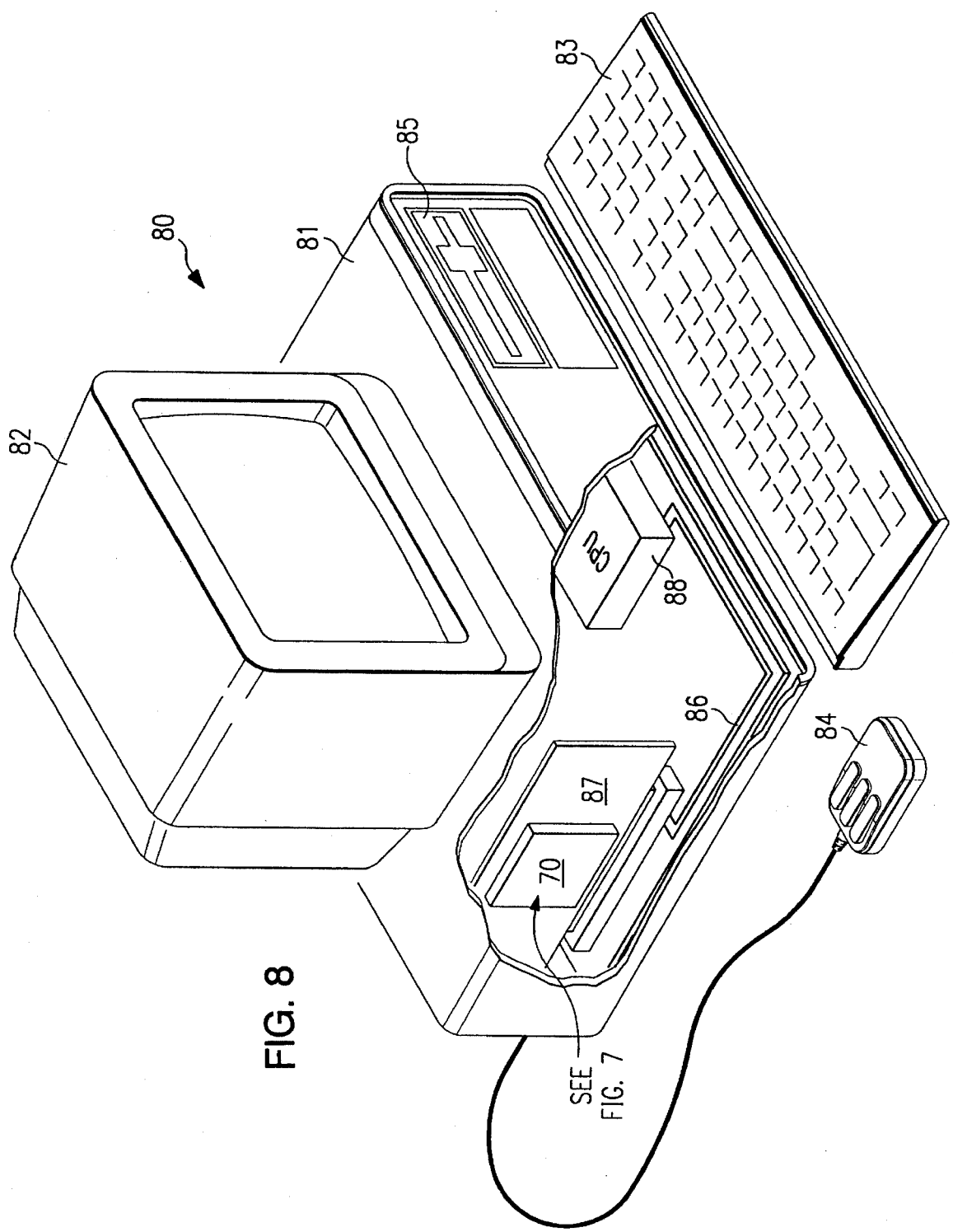
FIG. 8 illustrates a computer embodying the present invention.

Referring next to FIG. 8, there is shown a specific implementation of the present invention within processor-based computer system 80. System 80 includes display 82, disk drive and floppy disk drive 85, keyboard 83 and mouse 84. Chassis 81 encloses various computer hardware (not shown) typical of processor-based computing systems. Within chassis 81, CPU (central processing unit) 88 is coupled via bus 86 to hardware 87. Hardware 87 is a printed circuit board including VLSI circuit 70, which is coupled to CPU 88 and other hardware (not shown) within chassis 81.

To summarize, this invention significantly reduces the power dissipated by an OCD by limiting the output voltage swing at terminal OUT. To limit the output swing, this invention uses a special control circuit to regulate the gate bias of NFET pull-up transistor Q1. The advantages associated with this unique design are:

Power reduction of approximately 40 percent,

Performance comparable to full output swing OCDs,

Reduction of short circuit current in the output stage,

Single power supply,

Improved $V_{OH}$ vs. $I_{OH}$ characteristics, and

Reduced sensitivity to process and power supply variation.

For those skilled in the art, the same circuit configuration can be used for an n-well process with only minor modifications.

Although the present invention and its advantages have been described in detail, it should be understood that various changes, substitutions and alterations can be made herein without departing from the spirit and scope of the invention as defined by the appended claims.

What is claimed is:

1. A CMOS off-chip driver circuit having a reduced power dissipation, comprising:

a data input terminal and a control signal input terminal coupled to pre-drive circuitry;

a first node coupled to said pre-drive circuitry and coupled to a gate electrode of a first n-channel FET, said first node associated with said data input terminal;

a second node coupled to said pre-drive circuitry, said second node associated with said control signal input terminal;

a second n-channel FET coupled between a first voltage supply and an output terminal, a p-well node of said second n-channel FET coupled to a source electrode of said second n-channel FET;

a third n-channel FET coupled between said output terminal and a second voltage supply, said second node coupled to a gate electrode of said third n-channel FET;

a p-channel FET coupled in series with a first resistor between said first voltage supply and a third node coupled to a gate electrode of said second n-channel FET; and a fourth n-channel FET coupled in series with a second resistor between said third node and said second voltage supply, a p-well node of said fourth n-channel FET coupled to a source electrode of said fourth n-channel FET, wherein said first node is coupled to a gate electrode of said p-channel FET and said first n-channel FET is coupled between said third node and said second voltage supply.

2. A driver circuit comprising:

means for receiving an input data signal having a voltage swing of a first magnitude; and means, coupled to said receiving means, for outputting an output data signal to an output terminal, said output data signal corresponding to said input data signal, said output data signal having a voltage swing of a second magnitude wherein said second magnitude is less than said first magnitude, said outputting means including:

a pull-up transistor coupled in series with a pull-down transistor between first and second voltage sources of given magnitudes;

said output terminal coupled to a junction coupling said pull-up transistor to said pull-down transistor; and means, coupled to said output terminal, for regulating a control voltage applied to a gate electrode of said pull-up transistor in order to produce said output data signal at said output terminal having a voltage swing of said second magnitude, wherein said second magnitude is less than said first magnitude, and wherein said regulating means includes:

a first FET coupled in series with a first resistor between said first voltage source and said gate electrode of said pull-up transistor;

a second FET coupled in series with a second resistor between said gate electrode of said pull-up transistor and said second voltage source, wherein a gate electrode of said second FET is coupled to said output terminal; and a third FET coupled between said gate electrode of said pull-up transistor and said second voltage source, wherein a gate electrode of said third FET is coupled to a gate electrode of said first FET and an input terminal, and wherein a gate electrode of said pull-down transistor is coupled to a control input.

* * * * *